(12) United States Patent
Huiberts et al.

(10) Patent No.: US 7,315,016 B2
(45) Date of Patent: Jan. 1, 2008

(54) ELECTRIC DEVICE AND METHOD FOR DRIVING AN ORGANIC DIODE IN A LIGHT SENSING STATE

(75) Inventors: Johannes Nicolaas Huiberts, Eindhoven (NL); Pieter Jacob Snijder, Eindhoven (NL); Ronald Van Der Werf, Eindhoven (NL); Adrianus Sempel, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 52 days.

(21) Appl. No.: 10/563,652

(22) PCT Filed: Jul. 1, 2004

(86) PCT No.: PCT/IB2004/051090

§ 371 (c)(1),
(2), (4) Date: Jan. 6, 2006

(87) PCT Pub. No.: WO2005/006459

PCT Pub. Date: Jan. 20, 2005

(65) Prior Publication Data

US 2006/0186320 A1  Aug. 24, 2006

(30) Foreign Application Priority Data

Jul. 10, 2003  (EP) .................................. 03102087

(51) Int. Cl.
*G01J 1/44* (2006.01)
*H01J 40/14* (2006.01)
*H03F 3/08* (2006.01)

(52) U.S. Cl. ..................................... 250/214 R; 257/80
(58) Field of Classification Search ............ 250/214 R, 250/214.1, 214 AL; 257/79, 80
See application file for complete search history.

(56) References Cited

U.S. PATENT DOCUMENTS

| 4,945,226 | A | | 7/1990 | Fukuda et al. |
| 5,504,323 | A | | 4/1996 | Heeger et al. |
| 5,698,048 | A | | 12/1997 | Friend et al. |
| 5,869,857 | A | * | 2/1999 | Chen ......................... 257/292 |
| 7,019,277 | B2 | * | 3/2006 | Scott-Thomas ......... 250/214 R |
| 2003/0010973 | A1 | | 1/2003 | Lorin et al. |
| 2003/0122749 | A1 | * | 7/2003 | Booth et al. ................... 345/82 |

FOREIGN PATENT DOCUMENTS

| DE | 3502325 A1 | 7/1986 |
| EP | 1205043 B1 | 5/2002 |
| GB | 2296815 A | 7/1996 |
| WO | WO9516275 | 6/1995 |
| WO | WO0199312 A1 | 12/2001 |
| WO | WO03054980 A2 | 7/2003 |

* cited by examiner

*Primary Examiner*—Thanh X. Luu
*Assistant Examiner*—Suezu Ellis (57) ABSTRACT

An electric device includes at least one organic diode and a driver for driving the diode in at least a light sensing state. A pre-pulse generator is provided for applying one or more electrical pulses to the diode prior to drive the diode in the light sensing state. The pulses include a positive electric pre-pulse and a negative pre-pulse.

12 Claims, 6 Drawing Sheets

ELECTRIC DEVICE AND METHOD FOR DRIVING AN ORGANIC DIODE IN A LIGHT SENSING STATE

The invention relates to an electric device comprising at least one organic diode, wherein said electric device comprises driving means for driving said organic diode in at least a light sensing state.

Organic electroluminescent displays and devices are fairly recently discovered technologies that are based on the realization that certain organic materials, such as certain polymers, may be used as semiconductors in a light-emitting diode. These devices are very promising due to the fact that the use of organic materials makes these devices light, flexible, and inexpensive to produce.

Recently, it has also been discovered that such organic materials applied in light-emitting devices may be used to measure or sense incident light. U.S. Pat. No. 5,504,323 discloses a dual function light-emitting diode. When the organic polymer layer of the diode is positively biased, the diode functions as a light emitter, and when the layer is negatively biased, it functions as a photodiode. It is preferred to bias the diode in the photodiode mode with a rather high reverse bias, since the photosensitivity of the layer increases with the reverse bias voltage.

A problem associated with the prior art is that the photodiode mode or light sensing state of the organic diode is not optimal.

It is an object of the invention to provide an electric device with an organic diode having an improved performance in the light sensing state.

This object is achieved by providing an electric device that comprises pre-pulse means for applying one or more electric pulses to said organic diode prior to driving said organic diode in said light sensing state.

It has been observed that the performance of the organic diode in the light sensing state is considerably increased by the application of electric pulses, hereinafter also referred to as pre-pulses, prior to driving the organic diode in the light sensing state. It is believed that the electric pulses affect the occupation of trapping states for the charge carriers as a result of which the performance can be influenced. A positive electric pre-pulse has been observed to improve the light sensitivity or photoresponse of the organic diode, whereas a negative pre-pulse was found to decreases the time that the organic diode is in the light sensing state for accurately measuring or sensing incident light. Preferably the positive pre-pulse is a voltage pulse having a value around or just above that of the built-in voltage of the organic diode. The built-in voltage is the voltage at which the electric field in the organic layer due to the applied voltage is exactly 0 V/m. At values above the built-in voltage a forward current runs through the organic material of the diode, whereas for smaller and negative values only a small reverse current exists.

In an embodiment of the invention the pre-pulse means are adapted to apply a positive and a subsequent negative pre-pulse to the organic diode. In such an embodiment both the light sensitivity and the time necessary for reaching the light sensitivity state can be improved.

In an embodiment of the invention the electric device is a dual function device, wherein the electric device is arranged to drive said at least one organic diode alternately in a light emission state and said light sensing state. One or more organic diodes receiving the pre-pulses preferably are part of a display. The alternating states may have respective durations of approximately 0-20 ms, thereby making it possible to integrate the method in an electric device having a display without the difference between the states being perceivable by the human eye. Dual function devices may be applied in a variety of ways as e.g. described in the non-prepublished patent application EP 01205043 in the name of the current applicant.

In an embodiment of the invention the electric device is arranged to drive said organic diode in said light sensing state by a voltage, said voltage having a value of substantially 0 volt. Such a driving signal for the light sensing state is advantageous in that it eliminates or substantially reduces the occurrence of leakage currents through the organic diode, thereby enabling a more reliable measurement of the photocurrent induced by the incident light.

The invention also relates to a method for driving an organic diode in a light sensing state comprising the steps of:
applying one or more electric pulses to said organic diode to prepare said diode for a light sensing state;
driving said organic diode in said light sensing state.

The electric pulses have been observed to improve the performance of the organic diode in the light sensing state.

Preferably the electric pulse is a positive voltage, said voltage having a value close to that of the built-in voltage of said organic diode, whereas the organic diode is preferably driven by a voltage having a value of substantially 0 volt for reasons mentioned above.

The invention will be further illustrated with reference to the attached drawings, which show a preferred embodiment of the invention. It will be understood that the device and method according to the invention are not in any way restricted to this specific and preferred embodiment.

Figure 1:
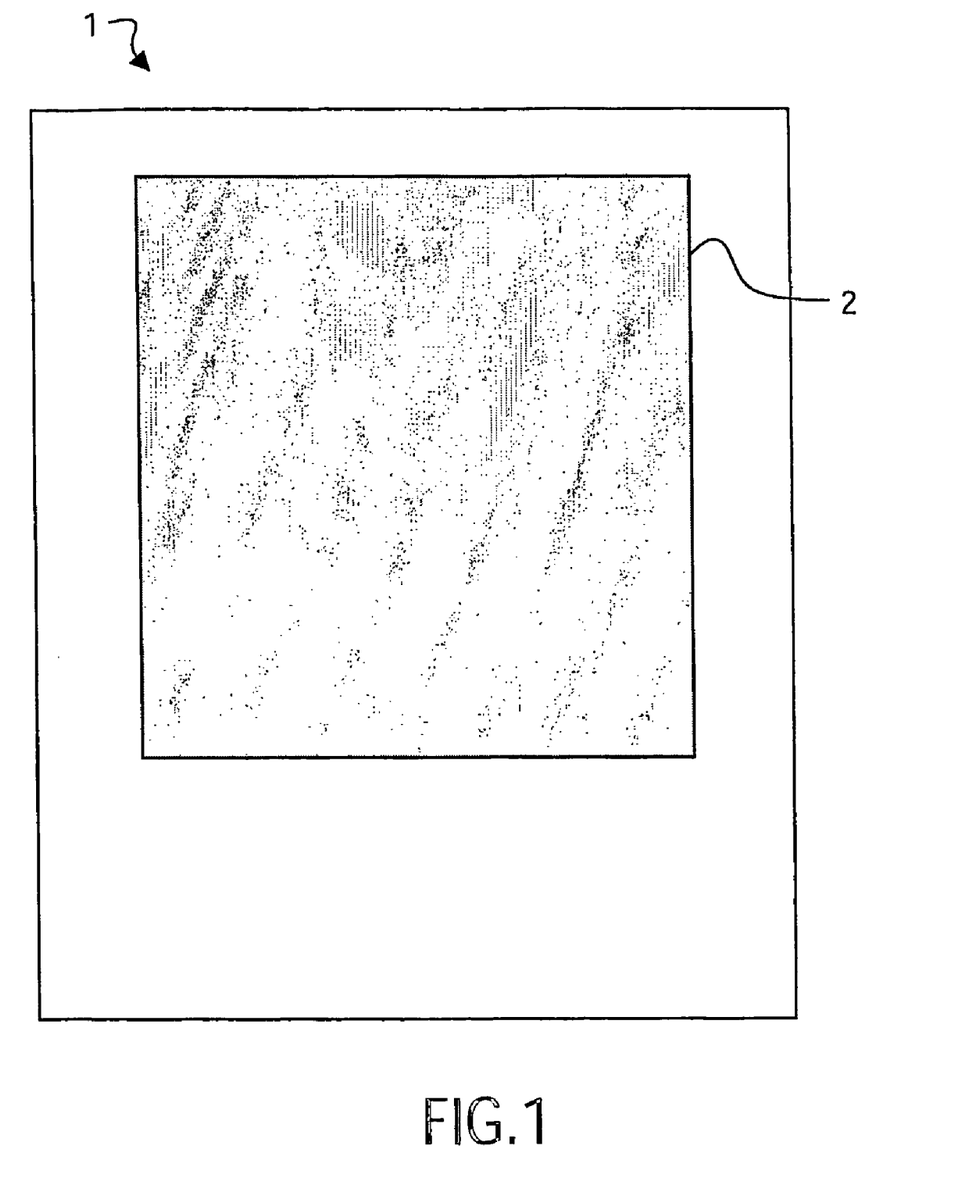
FIG. 1 shows an electric device according to an embodiment of the invention.

FIG. 1 shows an electric device 1 comprising a display 2 having one or more organic diodes. Such an electric device is e.g. a monitor or a handheld device, such as a mobile phone or a personal digital assistant (PDA). The electric device 1 may be a dual function electric device 1, wherein one or more of the organic diodes are able to both emit light in a light emission state E and to measure or sense incident light in a light sensing state S. The organic diodes may be implemented in a passive or active matrix arrangement of display pixels on the display 2.

Figure 2:
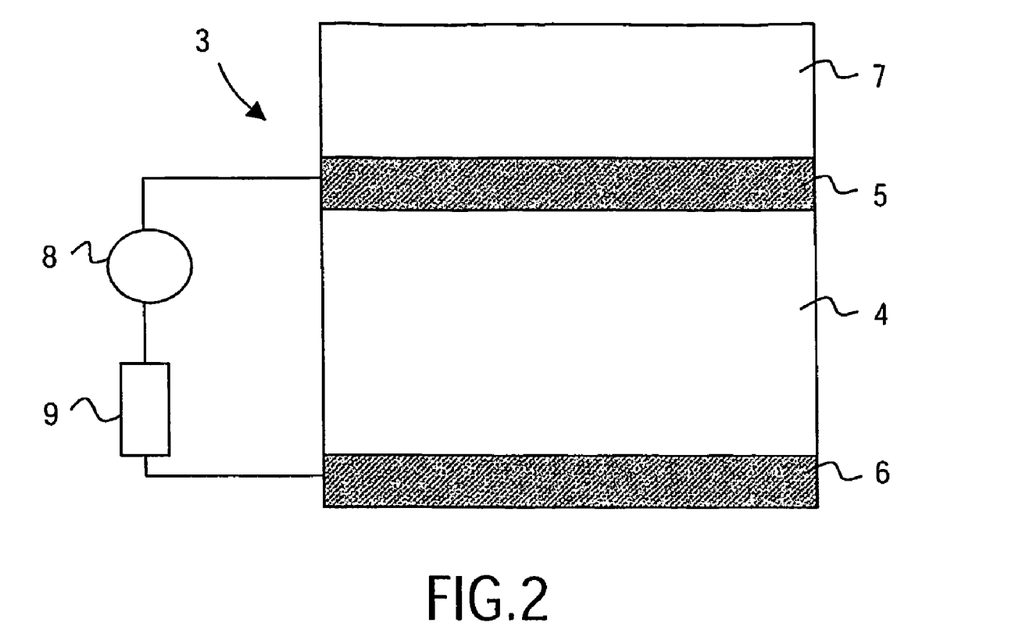
FIG. 2 shows an organic diode in the light emission state.

FIG. 2 shows a dual function organic diode 3, e.g. a polymer light emitting diode (PLED), in the light emission state E. Such an organic diode 3 comprises an active organic electroluminescent layer 4 of, for example, an electroluminescent polymer material, which is sandwiched between a first electrode 5 and a second electrode 6. It has been found that the optimum thickness of the organic layer 4 is in the interval between 60 and 90 nm, preferably about 70 nm, in order to achieve a high-efficiency emission state. The first electrode 5 may be a so-called hole-injecting layer, and the second electrode 6 may be a so-called electron-injecting layer. Furthermore, the diode 3 may or may not comprise a front substrate 7, having the functions of stabilizing the diode 3 and of separating the active photodiode parts from a potential user.

In the light emission state E, a first driving signal, such as a first voltage V1, is applied across the organic electroluminescent layer 4 by driving means 8, such as a power source, whereby light is emitted from said organic electroluminescent layer 4.

The first and the second electrode 5, 6 may have different work functions Φ. An optimum charge injection into the polymer layer 4 may be achieved thereby during the light emission state E, since the work function is a measure of the energy required to remove an electron from the surface of the first and the second electrode 5, 6, respectively. The first electrode 5 has a high work function ($\Phi_1$~5.2 eV), and this electrode 5 is arranged to remove electrons from the valence states with high binding energy, leaving positive holes behind in these states. The second electrode 6 has a low work function ($\Phi_2$~2.0 eV), and the electrons are loosely bound in the material. The work function difference is arranged to be larger than the band gap (i.e. the emission energy plus the Stokes shift) in order to get an optimum injection. The work function difference is accordingly dependent on the band gap, and is approximately 2 eV for red and 3.2 eV for blue. In the present case, the combination has a work function difference of approximately 3.2 eV, which is sufficient to ensure optimum injection for all colors. Moreover, the work function difference may be greater than 3.0 eV in an embodiment of the invention in order to ensure optimum injection for blue materials. The second electrode 6 is arranged to inject negatively charged electrons in the conduction states of the material, where the electrons also have a low binding energy. In forward driving the diode 3 (where the first electrode 5 is positive and the second electrode 6 is negative), the holes and electrons move towards each other, the electrons filling up the holes, and the increase in binding energy results in the release of a photon, i.e. light is emitted.

When the diode 3 is driven in the light emission state E, a certain voltage, referred to as the built-in voltage $V_{bi}$ of the diode 3, needs to be applied before any current will start to flow through the layer 4. After this built-in voltage $V_{bi}$ has been reached, the level of the current through the layer 4 will increase rapidly. The value of said built-in voltage is proportional to the difference between the work functions of the first and second electrodes.

Figure 3:
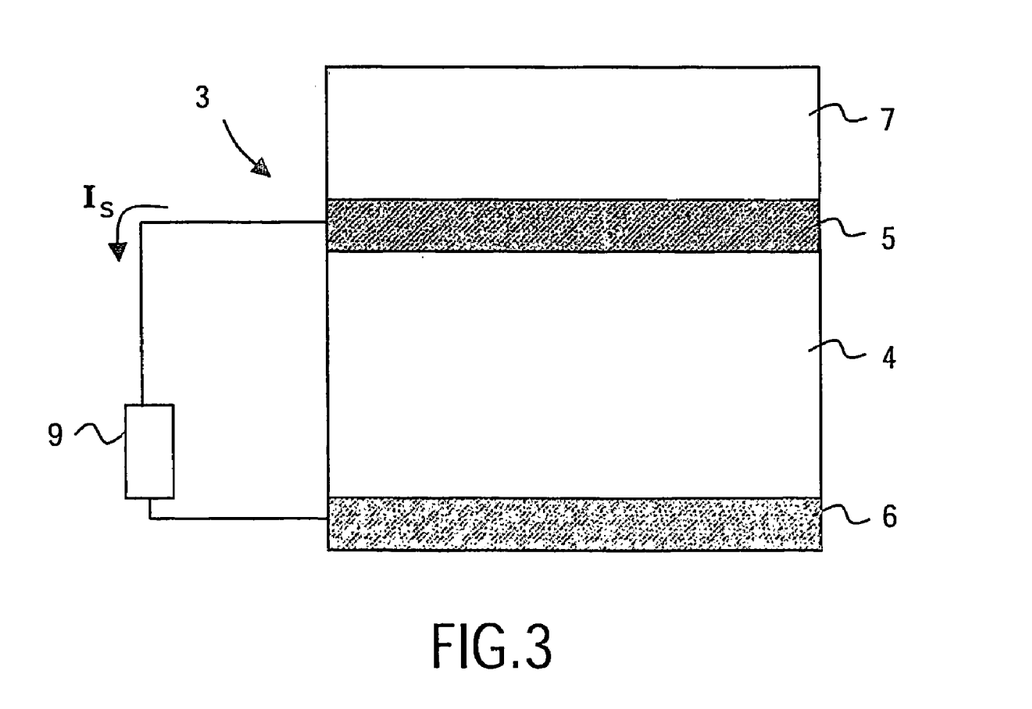
FIG. 3 shows an organic diode in the light sensing state.

FIG. 3 shows the organic diode 3 in the light sensing state S. In this state S a second driving signal, such as a second voltage V2, is applied across the organic electroluminescent layer 1, said voltage being applied by the power source 8 of FIG. 2 or by means of a separate driving means (not shown), and light incident on the layer 4 will give rise to the generation of a photocurrent $I_s$ in the organic electroluminescent layer 4. Preferably the second driving signal is a voltage V2=0V (short-circuit configuration), i.e. a zero voltage is applied across the organic layer 4. In this light emission state S the two electrodes 5, 6, now having the same potential, are separated by the insulating polymer electroluminescent layer 4. However, small leakage paths are always present in said layer, through which a small amount of charge is allowed to flow, provided there is a driving force. The above-described difference in work function between the first and the second electrode causes electrons in the layer 4 to experience a high binding energy of the first electrode 5 and a low binding energy of the second electrode 6. Electrons will thus move from the second electrode 6 to the first electrode 5, and a small relaxation current $I_r$ (present during a short time interval Δt only) will flow until an equilibrium state is reached. Initially both electrodes 5, 6 were neutral, but owing to said relaxation current $I_r$ the first electrode 5 becomes negatively charged and the second electrode becomes positively charged, resulting in a negative field across the organic layer 4. As was indicated above, a zero applied voltage V2 has advantages relating to the leakage current and the low power consumption necessary for the sensing state S. At V2=0V, the electrodes 5,6 are set at the same voltage, and the leakage currents are accordingly forced to 0 as no external field is applied across the organic layer 4. However, the relaxation current $I_r$ gives rise to a negative internal electric field which is used to drive a photo-current, generated as external light hits the device in the sensing state. In the above case, the size of the internal field is given by:

$$E_{int} = V_{bi}/t_{layer}$$

where $E_{int}$ is the internal field, $V_{bi}$ is the above built-in voltage, and $t_{layer}$ is the thickness of the organic layer 4. For incident light on the diode 3, electrons being in a valence state are excited to a conduction state, and the negative internal electric field breaks up the electron-hole pair, pulling the electron towards the second electrode 6 and the hole towards the first electrode 5. Consequently, a small, measurable photocurrent $I_s$ is generated. Furthermore, since the built-in voltage $V_{bi}$ is proportional to the difference between the two work functions $\Phi_1$, $\Phi_2$ of the first electrode 5 and the second electrode 6, the internal electric field is also proportional to the work function difference, i.e. the larger the difference between the two work functions, the larger the internal electric field at V2=0V applied voltage.

The photocurrent $I_s$ may be measured, for example, by measuring the voltage drop across a measuring circuit 9 which is connected in series with the power source 8 between said first and second electrodes 5,6. An example of such a measuring circuit 9 comprises a high-ohmic resistor connected in parallel with an amplifier, both the resistor and the amplifier being connected in series with the organic electroluminescent layer 4 (see FIG. 8). Moreover, a high input impedance device (such as a CMOS) is required because of the small photocurrent that is to be measured. The measured photocurrent $I_s$ may subsequently be transmitted to a determination device (not shown) for determining a suitable value for the first driving signal, based on the incident light. Consequently, the electric device 1 may e.g. be used for adjusting the light emitted by the display 2 in the light-emitting state E, based on information regarding the power of the incident light during the light sensing state S.

Figure 4:
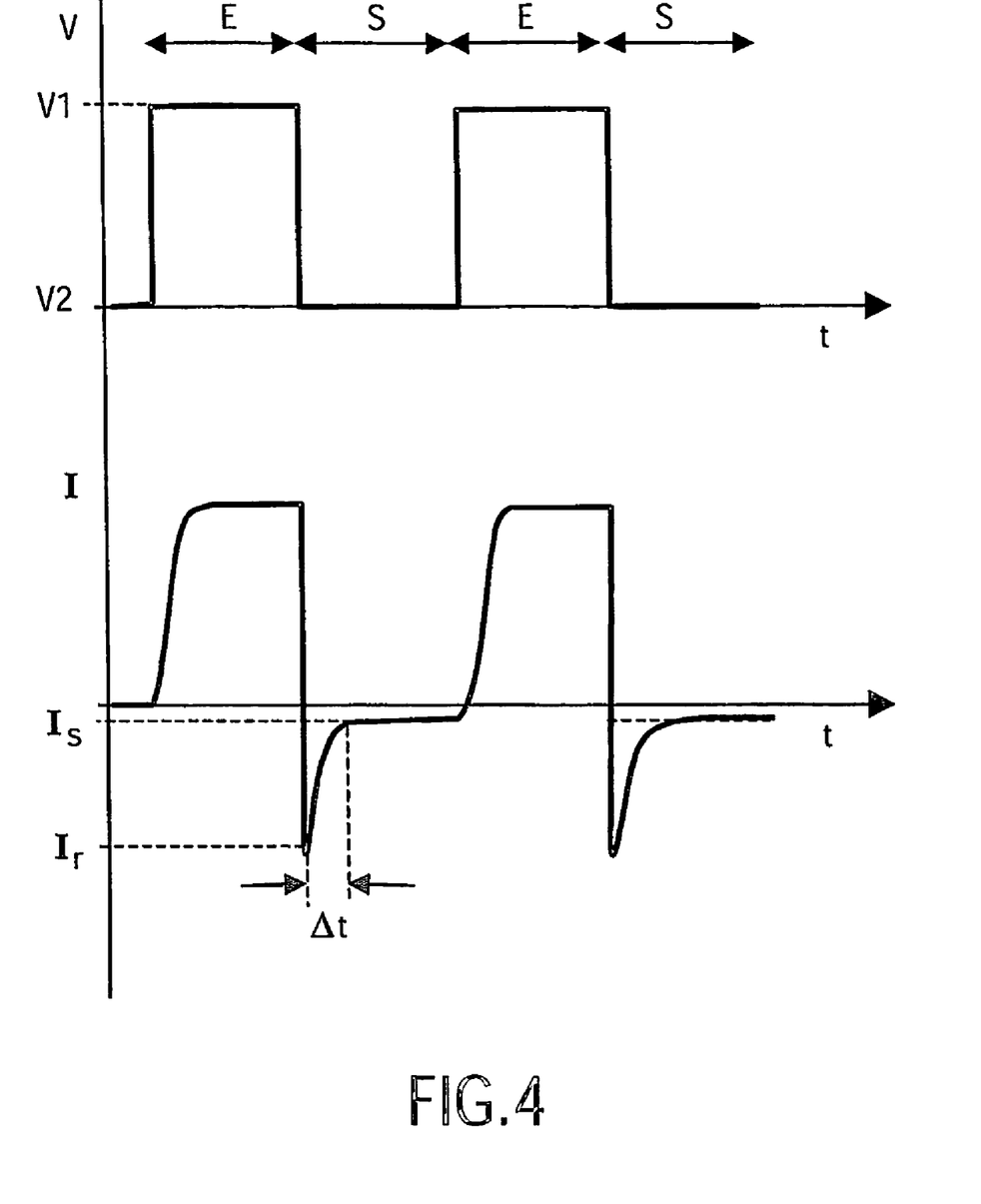
FIG. 4 shows schematically characteristics of an organic diode for the light emission state and the light sensing state in an alternating fashion of these states.

In FIG. 4 the upper schematic characteristic shows the driving signal V applied to the diode 3 shown in FIGS. 2 and 3. The driving signal V alternates between V1 for the light emission state E and V2 for the light sensing state S, wherein preferably V2=0V. The bottom characteristic shows a schematic impression of the observed current I through the layer 4. Clearly, a relaxation current $I_r$ is visible immediately after removal of the driving signal V1. A time Δt is required before an adequate determination of the photocurrent $I_s$ can be made.

It has been experimentally found that the performance of the organic diode 3 in the light sensing state S can be significantly increased by applying an electrical pulse prior to the light sensing state S. It is noted that the start of the light sensing state S not necessarily coincides with the end of the light emission state E for a dual function device, as shown in FIG. 7. A time gap between these states may be present, e.g. by connecting the sensing circuitry (see FIG. 8) only after the end of the light emission state E.

Figure 5A:
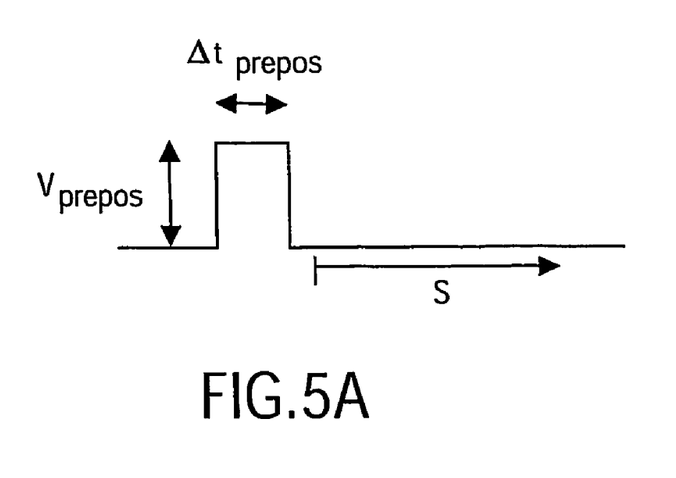
FIGS. 5A and 5B show an experimental characteristic of the light sensitivity of the organic diode on appliance of a positive pre-pulse.

FIG. 5A shows the positive electric pre-pulse $V_{prepos}$ that was applied to the polymer diode 3 for a time interval $\Delta t_{prepos}$ of 700 µs under constant illumination. It is believed that the fast response time generally observed for PLED devices makes the time interval $\Delta t_{prepos}$ not critical; values of a few microseconds are believed to be sufficient. The driving voltage V2 was 0V for reasons described above.

Figure 5B:
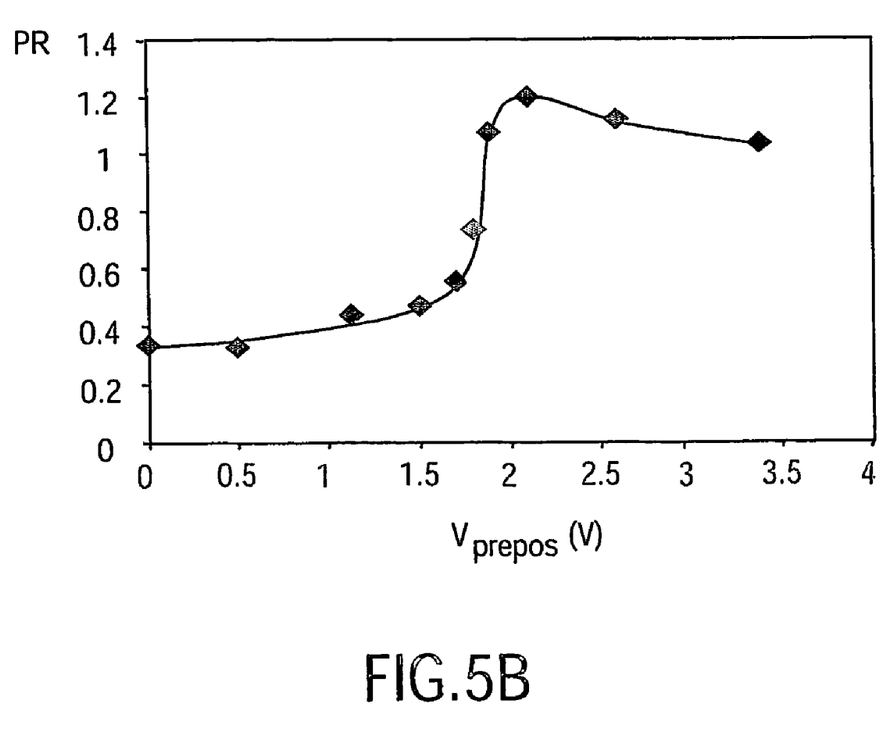

FIG. 5B shows the amplitude of the photoresponse PR of the diode 3. When the pre-pulse $V_{prepos}$ reached a value just below the built-in voltage $V_{bi}$ a slight increase of the light sensitivity PR resulted. When the applied value for $V_{prepos}$ exactly equaled the built-in voltage of the diode 3 a sudden fast increase of the light sensitivity or photoresponse PR was observed. However the exact value of the built-in voltage for a polymer LED device depends on the work function of the surrounding electrodes 5, 6 amongst other effects, as described above. Therefore it is believed that the sudden increase of the light sensitivity PR depends on the electrodes 5, 6 and polymer composition in the same way as the built-in voltage does. At higher voltage values for the pre-pulse $V_{prepos}$ the light sensitivity decreased again.

It is believed that only the occupation of a certain type of deep charge traps is responsible for this increase of the exciton dissociation probability. These traps are filled by the first charges that enter the polymer layer 4. A further increase of the charge carrier density by increasing the amplitude of the pre-pulse does not result in any further improvement of the sensing signal. Before the light sensing phase S also a negative pre-pulse was applied. This pre-pulse had no noticeable influence on the increase of the light sensitivity measured within a few ms after the application of the positive pre-pulse. This also indicates that deep traps may be involved in the increase of the photocurrent due to the positive pre-pulse.

Figure 6:
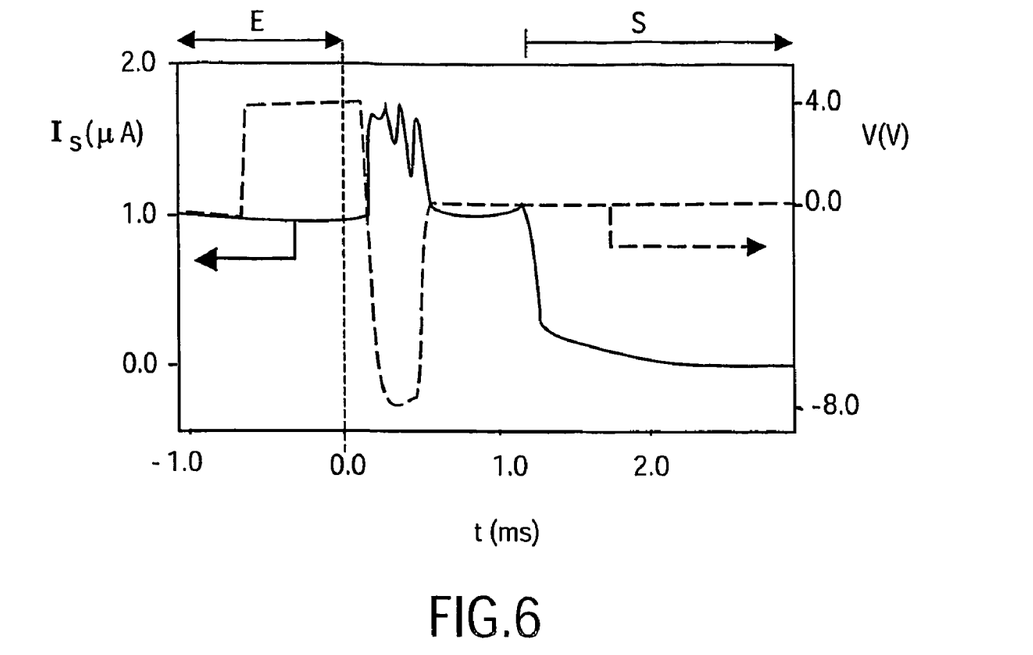
FIG. 6 shows an experimental characteristic of the time response of the organic diode on appliance of a negative pre-pulse.
Figure 8:
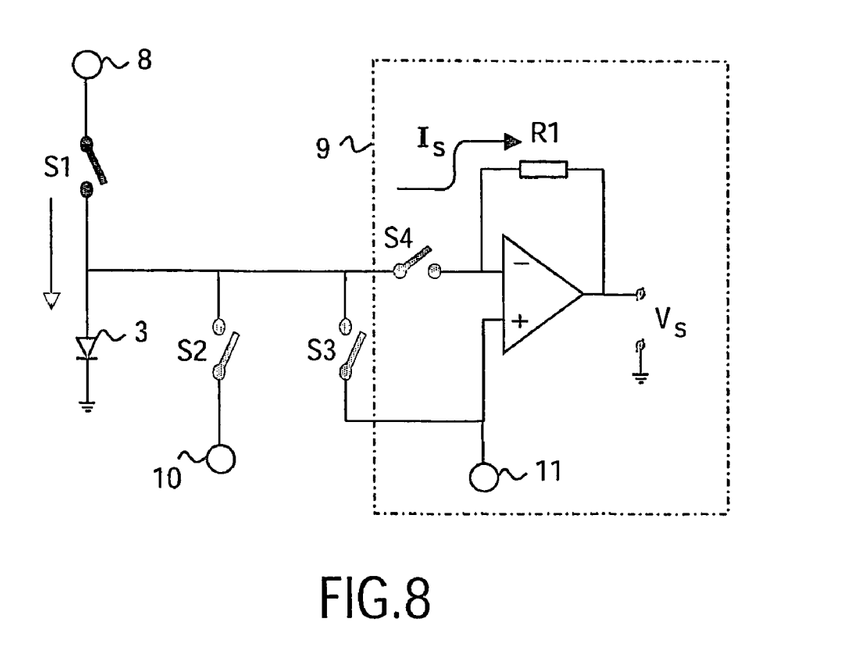
FIG. 8 shows an embodiment of the driving and sensing circuitry for application of the invention in an electric device shown in FIG. 1.

In FIG. 4 it was shown that the diode 3 needed a time $\Delta t$ of 20 ms before the relaxation current $I_r$ no longer obscured the photocurrent $I_s$, after the removal of a 4V driving signal V1 in the light emission state E. However, as shown in FIG. 6, on the application of a negative pre-pulse $V_{preneg}$ of −8 Volt for $\Delta t_{preneg}$ of 0.5 ms (see dashed curve) in between the light emission state E and the light sensing state S, this time was observed to decrease to a value below 1 ms (see solid curve). For the measurement of FIG. 6 no incident light was shed on the diode 3 during the light sensing state S. The sensing circuitry, of which an embodiment is shown in FIG. 8, was activated or coupled after approximately 1 ms from the end of the light emission state E. At this time the relaxation current $I_r$ was found to have been already significantly reduced (solid curve). Thus, the application of a negative pre-pulse reduces the time $\Delta t$ required for accurate sensing of the photocurrent $I_s$ after the light emission state E by a factor of 20. Given the fact that 100 Hz is a reasonable driving frequency for a passive matrix display 2 (10 ms per frame) a 20 ms waiting time between the state E and the state S does not allow for dual function display without loss of performance, whereas a waiting time of 1 ms does. Accurate and quick measurement of the photocurrent $I_s$ may be required for some applications, such as light sensitive lighting applications, e.g. lighting with dynamic feedback.

Figure 7A:
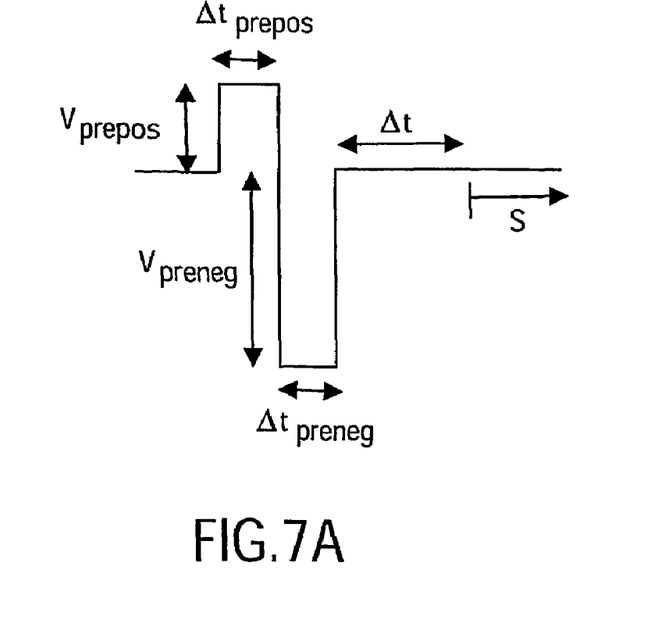
FIGS. 7A and 7B show an experimental characteristic of the light sensitivity of the organic diode on appliance of a positive pre-pulse and a subsequent negative pre-pulse.

FIG. 7A shows a characteristic wherein the pre-pulse means generates a combination of a positive pre-pulse $V_{prepos}$ and a subsequent negative pre-pulse $V_{preneg}$. This combination of prepulses was applied to a polymer diode 3, shown in FIGS. 2 and 3.

Figure 7B:
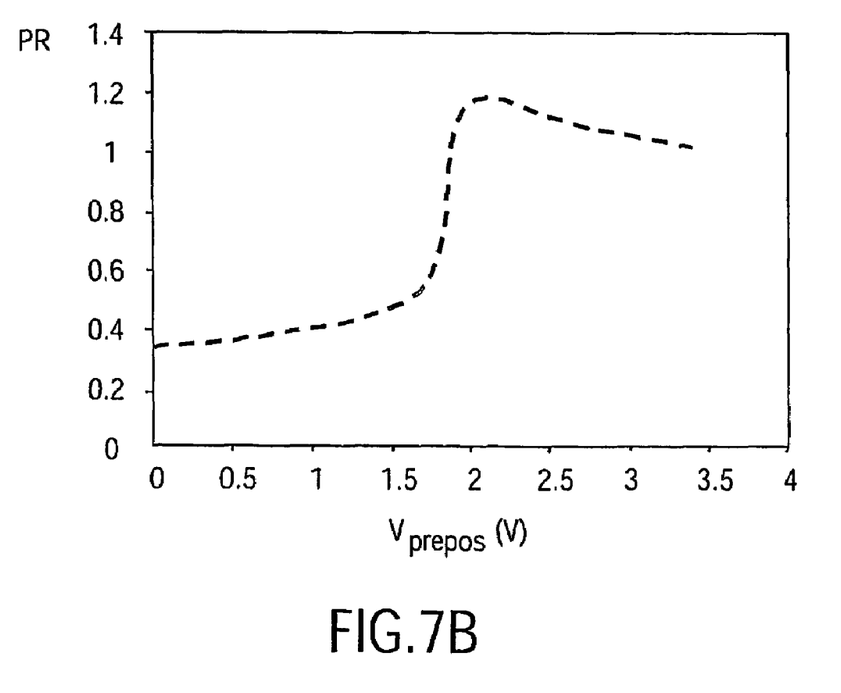

FIG. 7B shows that the increase in light sensitivity PR by a factor of 4 was found to be maintained in comparison with FIG. 5B on the application of such a combination of electric pulses.

The application of a positive pre-pulse and a subsequent negative pre-pulse thus resulted in an improvement of the photoresponse PR by a factor of 4 combined with a strong decrease of the waiting time $\Delta t$ between the light emission state E and the light sensing state S for an accurate measurement of the photocurrent $I_s$. By applying this combination the previous history (emitting light or not) of the diode 3 is irrelevant for the result of the sensing action about 1 ms after the application of this combination of a positive and a negative pre-pulse.

It is believed that the nature of the trapped charges responsible for the improvement of the photoresponse PR is such that they are not removed by the application of a negative pulse, at least as long as the amplitude remains sufficiently small. The negative pre-pulse does remove the (many) charge carriers in shallow traps responsible for the relaxation current $I_r$ after the emission state E, but leaves intact the few deeply trapped charges that are believed to be responsible for the photoresponse improvement.

Finally in FIG. 8 a circuitry embodiment is shown wherein the measuring circuit 9 and the pre-pulse means 10 for applying the electric pre-pulses to the diode 3 are combined. In the light emission state E switch S1 is closed to have the diode 3 emit light by applying a driving signal V1 via the power source 8. Opening switch S1 and closing switch S2 allows for applying a negative pre-pulse $V_{preneg}$ to prepare the diode 3 for the light sensing state S. The light sensing state S is initiated by coupling the measuring circuit 9 by closing the switch S4, wherein the photocurrent $I_s$ can be measured by means of the amplifier and the resistance R1 as a voltage, indicated by means of $V_s$ (=$I_s$R1). For optimal measurement of the photocurrent $I_s$ the switch S3 may be closed and opened again previously to connecting the measurement circuit 9 to reset the circuitry via reset means 11. It is noted that various embodiments are possible for the circuitry arrangement, such as a combination of the driving means 8 and the pre-pulse means 10.

The invention claimed is:

1. An electric device comprising at least one organic diode, wherein said electric device comprises:
    driving means for driving said at least one organic diode in at least a light sensing state, and
    pre-pulse means for applying one or more electric pulses to said at least one organic diode prior to driving said at least one organic diode in said light sensing state, wherein said pre-pulse means are arranged to apply a positive electric pulse and a subsequent negative electric pulse prior to driving said at least one organic diode in said light sensing state.

2. The Electric device according to claim 1, wherein said electric device is arranged to drive said at least one organic diode alternately in a light emission state and said light sensing state.

3. The Electric device according to claim 1, wherein said electric device comprises a display with one or more of said at least one organic diode.

4. The Electric device according to claim 1, wherein said electric device is arranged to drive said at least one organic diode in said light sensing state by a voltage, said voltage having a value of substantially 0 volt.

5. A method for driving an organic diode in a light sensing state comprising the acts of:
applying one or more electric pulses to said organic diode to prepare said diode for a light sensing state;
driving said organic diode in said light sensing state;
wherein the applying act applies a positive electric pulse and a subsequent negative electric pulse prior to driving said organic diode in said light sensing state.

6. The method according to claim 5, wherein said positive electric pulse has a positive voltage, said positive voltage having a value close to that of a built-in voltage of said organic diode.

7. The method according to claim 5, wherein said organic diode is driven by a voltage, said voltage having a value of substantially 0 volt.

8. An electric device comprising:
at least one organic diode having electrodes;
a driver connected to said electrodes and configured to drive said at least one organic diode in at least a light sensing state, and
pre-pulse generator configured to apply one or more electric pulses to said organic diode prior to driving said organic diode in said light sensing state, wherein said pre-pulse generator is further configured to apply a positive electric pulse and a subsequent negative electric pulse prior to driving said organic diode in said light sensing state.

9. The electric device of claim 8, wherein said positive electric pulse has a positive voltage, said positive voltage having a value close to that of a built-in voltage of said organic diode.

10. The electric device of claim 8, wherein said organic diode is driven by a voltage, said voltage having a value of substantially 0 volt.

11. The electric device of claim 8, wherein said electric device is arranged to drive said organic diode alternately in a light emission state and said light sensing state.

12. The electric device of claim 8, further comprising a display including at least one of said organic diode.

* * * * *